US006774378B1

(12) United States Patent
Huang et al.

(10) Patent No.: US 6,774,378 B1
(45) Date of Patent: Aug. 10, 2004

(54) METHOD OF TUNING ELECTROSTATIC QUADRUPOLE ELECTRODES OF AN ION BEAM IMPLANTER

(75) Inventors: Yongzhang Huang, Hamilton, MA (US); Xiangyang Wu, Andover, MA (US); Hans J. Rutishauser, Lexington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/681,511

(22) Filed: Oct. 8, 2003

(51) Int. Cl.[7] ........................ H01J 37/317; H01J 49/42; H05H 9/00

(52) U.S. Cl. .............................. 250/492.21; 250/492.2; 315/505; 313/359.1; 313/361.1

(58) Field of Search ......................... 250/492.21, 492.2; 315/505; 313/359.1, 361.1

(56) References Cited

U.S. PATENT DOCUMENTS 4,667,111 A 5/1987 Glavish et al.
6,242,747 B1 6/2001 Sugitani et al.
2002/0084427 A1 * 7/2002 Saadatmand et al. .... 250/492.1

* cited by examiner

*Primary Examiner*—Nikita Wells
(74) *Attorney, Agent, or Firm*—Watts Hoffmann Co., LPA

(57) ABSTRACT

The present invention concerns a method of tuning a plurality of electrostatic quadrupoles used for focusing an ion beam implanter. The steps of the method include: classifying the plurality of electrostatic quadrupoles into one of a predetermined number of groups, and for each of the predetermined number of groups, tuning the quadrupoles in the group by iteratively substituting values for a voltage ton be applied to each of the quadrupoles in the group using a multi-variable heuristic algorithm and concurrently measuring final beam current measured downstream of the ion accelerator to determine a set of applied voltage values that maximize the final beam current among those applied voltage values tested and utilizing the set of applied voltage values to tune the quadrupoles in the group. If the resulting ion beam is suitable, utilizing the determined applied voltages to tune the quadrupoles. If the resulting ion beam is not suitable, changing the predetermined number of groups and repeating the steps of the method.

24 Claims, 6 Drawing Sheets

Comparison of Sequential Tuning Versus Tuning Utilizing the Simplex Algorithm for B+ 20KeV Ion Beam

| | Tuning Time | Beam current $I_{RES}$ & transmission rate (%) |
|---|---|---|
| All quads set to 2.5KV | | |
| Simplex tuning | 190sec | 1.34mA, 67% |
| Sequential tuning | 360sec | 0.93mA, 47% |
| All quads set to 2.0KV | | |
| Simplex tuning | 210sec | 1.43mA, 72% |
| Sequential tuning | 240sec | 0.7mA, 35% |
| All quads set to 1.5KV | | |
| Simplex tuning | 250sec | 1.07mA, 54% |
| Sequential tuning | 420sec | 0.56mA, 28% |
| All quads set to 1.0KV | | |
| Simplex tuning | 240sec | 0.66mA, 33% |
| Sequential tuning | 260sec | 0.68mA, 34% |

Fig.7

METHOD OF TUNING ELECTROSTATIC QUADRUPOLE ELECTRODES OF AN ION BEAM IMPLANTER

FIELD OF THE INVENTION

The present invention relates to an ion beam implanter having a plurality of electrostatic quadrupoles for controlling ion beam divergence and, more particularly, to a method of tuning the plurality of electrostatic quadrupoles of such an ion beam implanter.

BACKGROUND ART

Ion beam implanters are widely used in the process of doping semiconductor wafers. An ion beam implanter generates an ion beam comprised of desired species of positively charged ions. The ion beam impinges upon an exposed surface of a workpiece such as a semiconductor wafer, substrate or flat panel, positioned in an implantation chamber, thereby "doping" or implanting the workpiece surface with desired ions.

One type of ion beam implanter suitable for deep implantation of ions into a semiconductor wafer workpiece utilizes an radio frequency (RF) accelerator (linac) to accelerate ions to high energy levels on the order of 1 million electron volts (MeV) per charge state. Such an accelerator typically utilizes multiple resonator modules, with each module including an accelerating electrode. The RF accelerator is controlled to take into account the mass, charge and initial velocity of the ions forming the ion beam. After traversing the RF accelerator resonator modules, a focused, high energy ion beam is directed to the workpiece to be implanted. A high energy ion beam implanter having an RF accelerator is disclosed in U.S. Pat. No. 4,667,111, issued on May 19, 1987 to Glavish et al. and assigned to the assignee of the present invention. The '111 patent is hereby incorporated herein in its entirety by reference.

Both the amplitude (in kilovolts (kV)) and the frequency (in Hertz (Hz)) of the accelerating electrode output signal must be determined as operating parameters for each resonator module. Moreover, when a multiple-stage RF accelerator is utilized, the phase difference ($\Phi$) (in degrees (°)) of each accelerating electrode output signal is a third operating parameter that must be determined. The resonator modules operational parameters of amplitude, frequency and phase must be determined and implemented by the control circuitry and electronics of the ion implanter (in conjunction with a human operator of the ion implanter). This process is referred to as "tuning" the ion beam.

A method and system for determining operating parameters of the resonator modules for a multi-stage RF accelerator is disclosed in U.S. Pat. No. 6,242,747, issued on Jun. 5, 2001 to Sugitani et al. and assigned to the assignee of the present invention. The '747 patent is incorporated herein in its entirety by reference.

In a multi-stage RF accelerator or linac, the ion beam passes through a central opening of the accelerating electrodes of each of the resonator modules. Positioned on either side of an accelerating electrode and axially spaced apart from the accelerating electrode are grounded electrodes. In the two gaps between an accelerating electrode and its flanking grounded electrodes appropriate electrical fields are generated within the gaps by the accelerating electrode to accelerate the ions as they pass through the gaps. For example, as a group of positive ions pass through a gap approaching an accelerating electrode, the accelerating electrode is energized to a negative voltage to generate an axial negative electric field in the gap approaching the accelerating electrode. This negative electrical field causes the positive ions in the particle bunch to accelerate through the negative electric field toward the accelerating electrode.

As the particle bunch of positive ions pass through the accelerating electrode, the voltage of the accelerating electrode is reversed to a positive voltage thereby generating an axial positive electric field in the gap through which the ions travel as they move away from the accelerating electrode. This positive field in the second gap further accelerates the particle bunch. By appropriate choice of module dimension and frequency of electrode energization, alternate ion sources that produce light or heavy ions can be successfully accelerated along the ion beam beam path between an ion source and the implantation chamber so that sufficient energy of the ions is achieved for proper implantation depth of the ions into the workpiece.

One issue that arises in a high energy implanter is that of beam divergence or diffusion. Within each electrode gap, the axial electric field created to accelerate ions within the gap causes radial focusing (that is, narrowing) of the beam in the first half of the gap and radial defocusing (that is, widening) of the beam in the second half of the gap. Unfortunately, because the electric radial defocusing forces in the second half of the gap are stronger than the radial focusing forces in the first half of the gap, the net result is overall radial defocusing as the beam passes through each gap. One method of compensating for radial defocusing is to provide electrostatic lenses, such as electrostatic quadrupoles ("electrostatic quadrupoles"), along the beam line to provide for convergence effect on the beam. As many as twelve or more electrostatic quadrupoles may be used along the beam line and may be advantageously positioned within the RF accelerator, in front of the RF accelerator (that is, upstream of the RF accelerator resonator modules), and/or behind the RF accelerator (that is, downstream of the resonator modules).

The basic function of the electrostatic quadrupoles is to focus the beam and to transport the beam from the ion source to the workpiece with a high transmission rate. The transmission rate is defined as the ratio of the final beam current to the injection beam current. The addition of electrostatic quadrupoles, needed for ion beam convergence, complicates the tuning process, because in addition to determining the operating parameters (amplitude, frequency and phase) for the resonator modules, the ion implanter control circuitry (in conjunction with the operator) must also determine operating parameters for the electrostatic quadrupoles. An electrostatic quadrupole is energized by applying a DC voltage to the electrodes of the quadrupole so as to create a DC voltage differential across oppositely positioned electrodes of the quadrupole. Typically, in a unipolar quadrupole there are two electrodes positioned 180 degrees apart, a DC voltage is applied the one electrode while the other electrode is held at ground potential or a reference voltage thereby resulting in an applied DC voltage across the electrode pair. Thus, each quadrupole must be "tuned" by determining a magnitude of the DC voltage applied across the quadrupole electrodes such that, in combination with all of the other electrostatic quadrupoles, transmission rate is optimized, that is, the highest transmission rate is achieved while still maintaining suitable beam quality, that is, a suitable beam energy with minimum energy spread. Because of the number of electrostatic quadrupoles in a typical high energy implanter (typically 12), tuning the quadrupoles to achieve a maximum or near maximum transmission rate is problematic.

The resonator modules and electrostatic quadrupoles of present high energy ion beam implanters are typically tuned by an automatic tuning program or software that is part of the ion implanter control electronics. Such an automatic tuning program ("autotune program") utilizes a method of tuning that comprising sequential single parameter tuning, that is, a combination of single parameter tuning steps with each tuning step optimizing or setting a single control variable, that is, determining the amplitude, frequency and phase for each of the resonator modules and determining the magnitude of applied DC voltage for a single electrostatic quadrupole. Using this sequential tuning procedure, the autotune program tunes each parameter, that is, each resonator and each quadrupole individually until a satisfactory or acceptable beam is achieved. An example of a prior art sequential tuning program is depicted in the flow chart of shown in FIG. 3.

Empirical results have shown that the sequential, single parameter tuning of the electrostatic quadrupoles by the autotune program is slow and inefficient. Typically, sequential, single parameter tuning does not find the best beam for implantation, that is, the beam current with the highest transmission rate.

What is needed is an improved method of tuning a plurality of electrostatic quadrupoles of a high energy implanter that is faster than the present sequential, single parameter tuning method and produces a satisfactory beam. What is also needed is an improved method of tuning a plurality of electrostatic quadrupoles of a high energy implanter that generally produces a higher transmission rate tuned beam than the present sequential, single parameter tuning method.

SUMMARY OF THE INVENTION

The present invention concerns a method of tuning a plurality of electrostatic quadrupoles. Quadrupoles are used for focusing an ion beam in a high energy ion beam implanter and to transport the ion beam from the ion source injector (where ions are extracted from an ion source) to a workpiece to be implanted with ions which positioned in an implantation chamber. It should be recognized that the method of tuning of the present invention is suitable for use in ion beam implanters whether or not the implanter utilizes an RF accelerator for ion acceleration.

The steps of the electrostatic quadrupole tuning method include: grouping each of the plurality of electrostatic quadrupoles into one of a predetermined number of groups based on a primary function of each quadrupole, the predetermined number of groups being at least one less than a number of electrostatic quadrupoles; and for each of the groups of quadrupoles, tuning the quadrupoles in the group by iteratively substituting values for a voltage to be applied to each of the quadrupoles in the group using a multi-parameter search process and concurrently measuring final beam current measured downstream of the ion accelerator to determine a set of applied voltage values that maximize the final beam current among those applied voltage values tested and utilizing the set of applied voltage values to tune the quadrupoles in the group.

In one preferred embodiment, the predetermined number of groups of electrostatic quadrupoles is three and the primary function of quadrupoles each of the three groups is as follows:

a) group 1—functioning as a matching unit between an analyzing mass unit of the ion beam implanter and the ion accelerator by transforming an emittance orientation of the an ion beam to an orientation of an emittance of the ion accelerator;

b) group 2—transporting the ion beam through the ion accelerator; and c) group 3—functioning as a matching unit between the ion accelerator and a final energy magnet of the ion implanter by transforming the emittance orientation of the ion beam to an emittance of the final energy magnet.

In this embodiment, the electrostatic quadrupole tuning method is applied, independently on a group by group basis, to the quadrupoles of the each of the three groups and a maximum final beam current is found. If the determined maximum final beam current is found to be suitable, the tuning process is terminated and the quadrupoles are accordingly tuned to achieve the determined maximum beam current (that is, the maximum final beam current found using three group tuning). If, however, the determined final beam is deemed not to be suitable, then the predetermined number of groups is changed from three to one, that is, all of the quadrupoles are combined into a single group and the tuning method of the present invention is applied to the single group including all of the quadrupoles. A new maximum final beam current is found. Generally, this new final beam current will be greater than or equal to the maximum final beam current found through the three group quadrupole tuning process. The quadrupoles are accordingly tuned to achieve the new maximum final beam current.

In one preferred embodiment the invention includes a method of tuning a plurality of electrostatic quadrupole of an ion beam implanter, the steps of the method comprising:

a) grouping each of the plurality of electrostatic quadrupole into one of a predetermined number of groups based on a primary function of the quadrupole, the predetermined number of groups being at least one less than a number of electrostatic quadrupoles; and b) for each of the groups of quadrupoles, energizing the quadrupoles in the group by iteratively substituting values for a voltage to be applied to each of the quadrupoles in the group using a multi-parameter heuristic algorithm and measuring final beam current measured downstream of the ion accelerator to determine a set of applied voltage values that maximize the final beam current among those applied voltage values tested;

c) measuring one or more parameters of the ion beam upon completion of step (b);

d) determining if the ion beam is acceptable by comparing the one or more measured parameters of the ion beam to one or more standards:

i) if the resulting final beam current is acceptable, then utilizing the determined sets of applied voltage values to energize the quadrupoles in each of the groups; and ii) if the resulting final beam current is not acceptable, then changing the predetermined number of groups and repeating steps (a)–(d).

As an example, the one or more measured parameters compared to standards could advantageously include final ion beam current, ion beam energy, and ion beam energy spread.

In another aspect of the invention, a method of tuning a plurality of resonators and a plurality of electrostatic quadrupoles of an ion implanter includes the steps of: tuning the plurality of resonators to achieve a desired final beam energy with a minimum energy spread of the ion beam; and tuning the plurality of quadrupoles to maximize a transmission rate of the ion beam where the transmission rate is a ratio of a final beam current of the ion beam measured downstream of the ion accelerator to an injection beam current measured upstream of the ion accelerator.

The same multi-parameter search process used to tune the quadrupoles may also be applied to tune amplitude and phase of the plurality of resonators. Frequency of the resonators is generally set a predetermined value (typically, 13.56 megahertz (MHz)).

The step of tuning of the plurality of quadrupoles including the substeps of: classifying each of the plurality of electrostatic quadrupoles into one of a predetermined number of groups based on a primary function of the quadrupole, the predetermined number of groups being at least one less than a number of electrostatic quadrupoles; and for each of the groups of quadrupoles, tuning the quadrupoles in the group by iteratively substituting values for a voltage to be applied to each of the quadrupoles in the group using a multi-parameter heuristic algorithm and concurrently measuring final beam current to determine a set of applied voltage values that maximize the transmission rate among those applied voltage values tested and utilizing the set of applied voltage values to tune the quadrupoles in the group.

These and other objects, advantages, and features of the exemplary embodiment of the invention are described in detail in conjunction with the accompanying drawings.

BRIEF DESCRIPTION OF THE DRAWINGS

FIG. 7 is a chart of empirical test data comparing sequential tuning of 12 quadrupoles versus tuning 12 quadrupoles utilizing the method of the present invention of grouping of the quadrupoles by function and then applying the Simplex algorithm for a Boron+20 keV DC ion beam.

DETAILED DESCRIPTION

Figure 1:
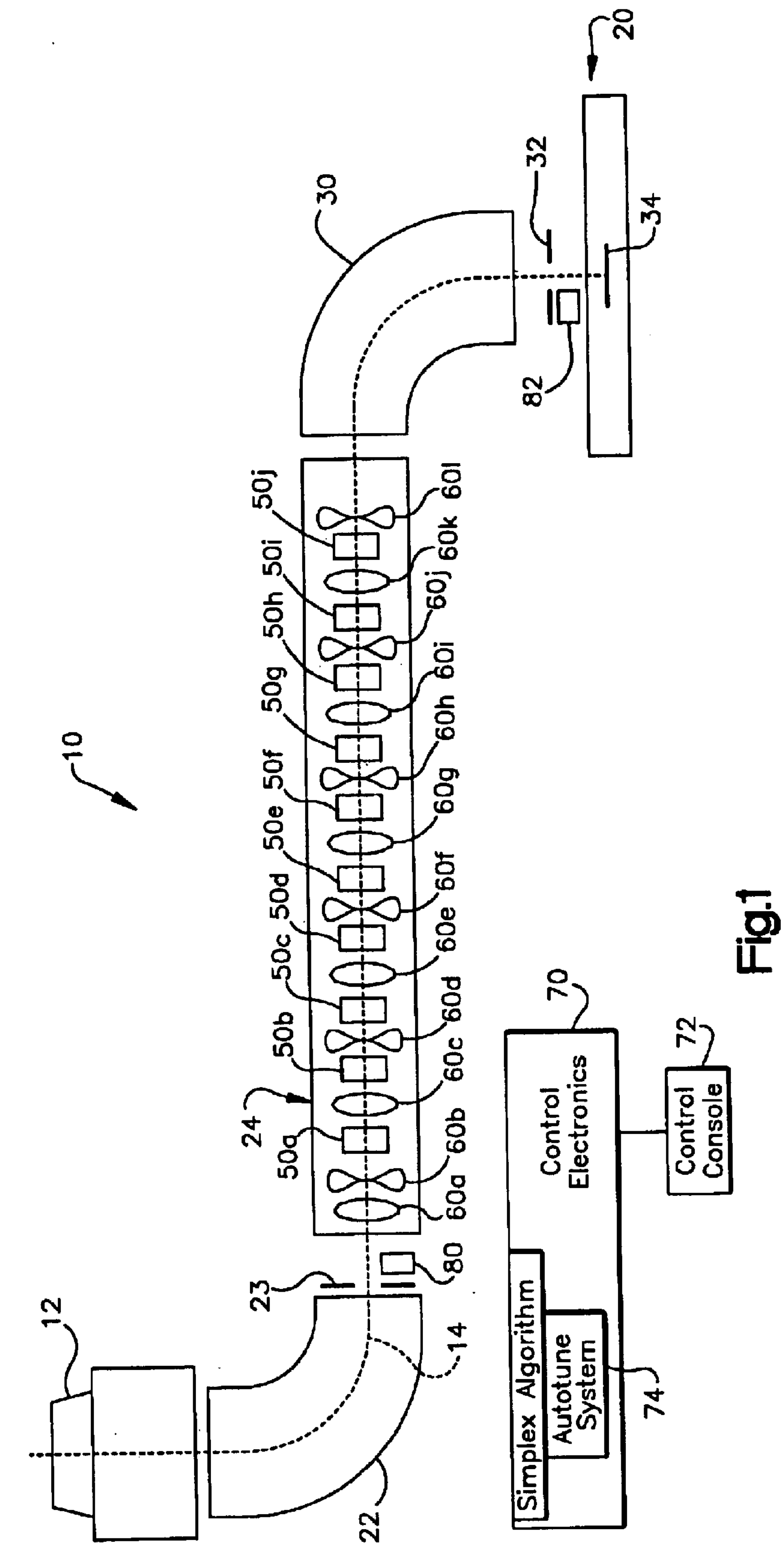
FIG. 1 is a schematic plan view of an ion beam implanter of the present invention.

Turning to the drawings, an ion beam implanter is shown schematically at 10 in FIG. 1. The implanter 10 directs high energy ions at a target and includes an ion source 12 for creating ions that are extracted from the source 12 to form an ion beam 14 which traverses a beam path to an end or implantation station 20. The ions generated by the source 12 pass through an analyzing mass unit (AMU) 22 and are directed through a separation split 23.

Ions of the ion beam 14 passing through the separation split 23 are directed to an RF accelerator or linac 24, which accelerates the ions to a desired energy level ranging between 200 kilo electron volts (keV) to 2 million electron volts (meV). The high energy ions leave the accelerator 24 in focused packets or bunches. This axial focusing effect on the ions in the ion beam 14 is caused by the radio frequency (RF) electric fields used in accelerating the ions. After acceleration by the accelerator 24, the packets of ions comprising the ion beam 14 are selected for proper energy and energy spread by a final energy resolving magnet (FEM) 30. The ions selected by the FEM 30 are directed through a separation split 32 and into the implantation station 20 to implant semiconductor workpieces 34 with ions.

The accelerator 24 includes a sequence of ten resonators 50*a–j* that accelerate packets of ions entering the accelerator 28. The resonators 50*a–j* are resonant circuits 52 which include acceleration electrodes driven by RF power circuits.

Control electronics (shown schematically at 70) are provided for monitoring and controlling the ion dosage received by the workpiece 34. Operator input to the control electronics 70 are performed via a user control console 72.

The ion beam current is measured by two Faraday cups 80, 82. The Faraday cup 82 downstream of the final energy resolving magnet (FEM) 30 measures the final beam current, $I_{res}$, that is, the effective beam current seen by the workpieces being implanted. The faraday cup 80 upstream of the accelerator 24 measures injection beam current, $I_{injection}$, that is, the starting beam current exiting the analyzing magnet unit (AMU) 22.

The ions in the ion beam 14 tend to diverge as the beam traverses a distance along the beam path between the ion source 12 and the implantation chamber 20. One method of controlling beam divergence is to intersperse a plurality of electrostatic quadrupoles (sometimes referred to as electrostatic quadrupoles lens) 60*a–l* (specifically 12 bipolar quadrupoles in the illustrated embodiment) along the beam path to focus the beam 14, including upstream, between and downstream of the resonators 50*a–j*. Additionally, the quadrupoles also function to transport the beam from the ion source 12 through the accelerator 24 and the final energy resolving magnet (FEM) 30 with the highest possible transmission rate where the transmission rate is defined as:

$$\text{Transmission Rate}=I_{res}/I_{injection}$$

where:

$I_{res}$=Final ion beam current as measured by the faraday cup 82 positioned downstream of the final energy resolving magnet (FEM) 30 and the separation split 32 and upstream of the implantation chamber 20; $I_{injection}$=Injection beam current as measured by the faraday cup 80 positioned just upstream of the RF accelerator 24 and downstream of the separator split 23.

Figure 2:
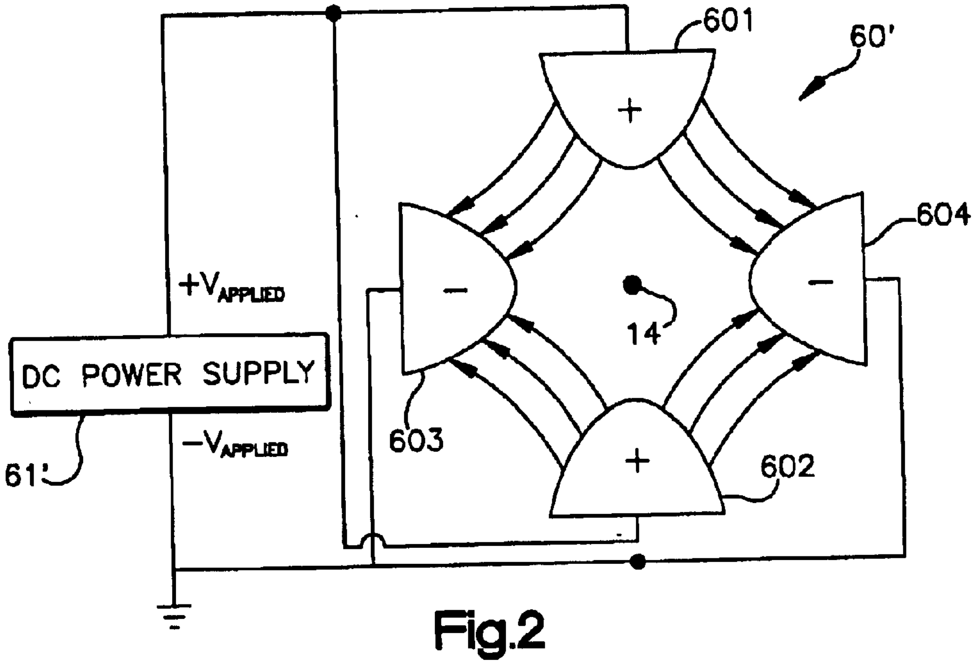
FIG. 2 is a schematic representation of electrodes of a bipolar electrostatic quadrupole.
Figure 3:
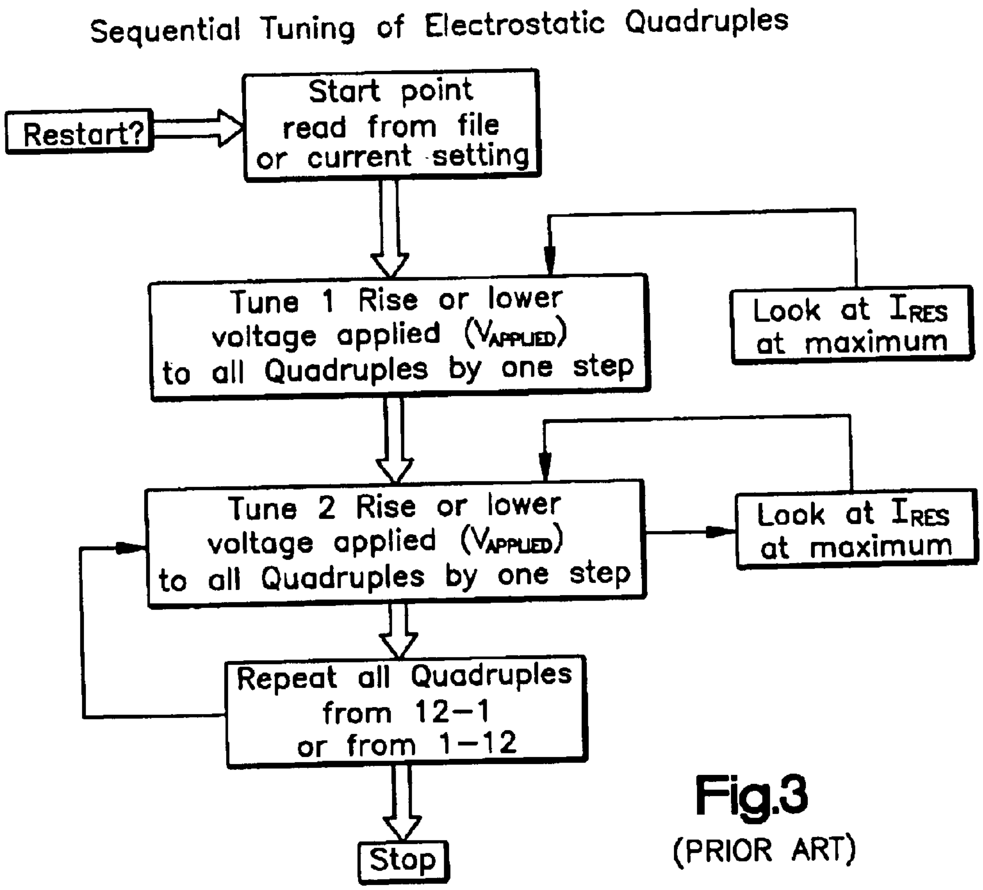
Fig.3 (PRIOR ART)
FIG. 3 is a flow chart showing a prior art method of sequentially tuning a plurality of electrostatic quadrupoles.

Two types of electrostatic quadrupoles are typically used in ion beam implanters, bipolar electrostatic quadrupoles and bipolar electrostatic quadrupoles. The ion beam implanter 10 utilizes bipolar quadrupoles, but it should be recognized that the tuning method of the present invention is suitable for any combination of unipolar and bipolar quadrupoles. In FIG. 2, a single bipolar electrostatic quadrupole is depicted at 60'. A DC power supply 61' (under the control of the control electronics 70) applies a positive voltage, $+V_{applied}$, to the pair of electrodes 601, 602 and a negative voltage, $-V_{applied}$, to the pair of electrodes 603, 604. The positive and negative applied voltages are typically substantially equal in magnitude. The electrodes 601, 602, 603, 604 generate electrostatic fields that selectively focus and defocus the ion beam 14 as it passes through the center point defined by the electrodes. The amount of focusing/defocusing obtained is a function of the magnitude of the positive and negative voltages, $+V_{applied}$, $-V_{applied}$, that bias the electrodes 601, 602, 603, 604.

In the schematic depiction of the ion implanter 10 of FIG. 1, the quadrupoles 60*a–l* are shown as being positioned within the RF accelerator 24, however, it should be recognized that the quadrupoles 60*a–l* may be positioned upstream and/or downstream of the accelerator 24. It should also be recognized that the number of quadrupoles may be more or less than twelve and the number of resonator modules may be more or less than ten. The transmission rate is an important indicator of beam performance and beam tuning quality, generally, the higher transmission rate, the better the quality of the ion beam for implantation purposes.

The resonator modules 50*a–j* of the accelerator 28 are typically energized at a frequency of 13.56 megahertz (MHz). The resonator structure is a two-gap coaxial structure with an annular electrode energized by the RF source flanked on each side by spaced apart grounded annular electrodes. The amplitude, frequency and phase of the RF field of each resonator 50*a–j* are tunable independently. Therefore, the accelerator 28 can accelerate ions with a wide range of mass to charge ratios. In order to shorten the physical length of the accelerator 28 along the beam line 16, the electrostatic quadrupoles are installed between two adjacent resonators.

Figure 1A:
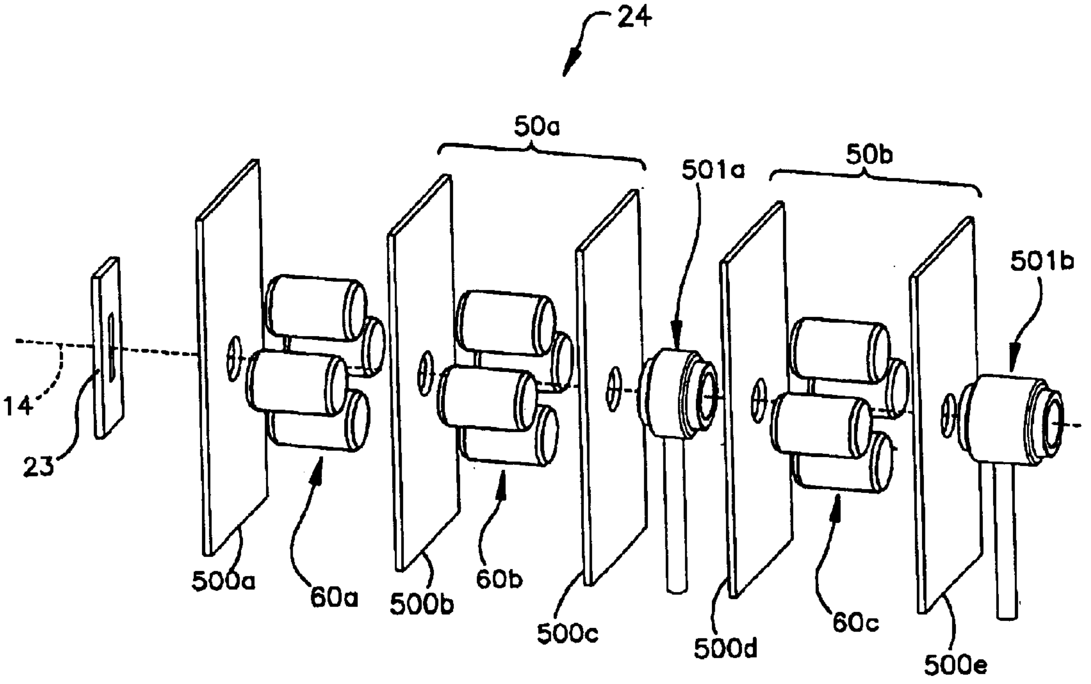
FIG. 1A is a schematic perspective view of a portion of a modular linear accelerator (linac) of the ion beam implanter of FIG. 1.

FIG. 1A schematically illustrates an upstream portion of the accelerator 28 including the first two resonator modules 50*a* and 50*b* which accelerate the ions of the ion beam 14. The first resonator module 50*a* includes an energizable acceleration electrode 501*a* positioned between equally spaced apart grounded electrodes 500*c* and 500*d*. The grounded electrodes 500*c*, 500*d* include cylindrical openings that the ion beam passes through. The second resonator module 50*b* includes an energizable acceleration electrode 501*b* positioned between equally spaced apart grounded electrodes 500*e* and 500*f*. The grounded electrodes 500*e*, 500*f* also include cylindrical openings that the ion beam passes through. The ion beam comprises an elongated slit profile as it passes through the aperture 23 having a vertically elongated slit. The beam 14 is formed into a generally circular profile via two electrostatic quadrupoles 60*a*, 60*b* and corresponding grounded electrodes 500*a*, 500*b*, wherein the grounded electrodes include cylindrical openings for the beam 14 to pass through. The first quadrupole 60*a* focuses the ion beam 14 in a vertical plane and the second quadrupole 60*b* focuses the ion beam 14 in the horizontal plane. A third quadrupole 60*c* is positioned between the first and second resonator modules 50*a*, 50*b* to provide for radial focusing of the ion beam 14 as it travels through successive acceleration modules. Although only one quadrupole is shown between the first and second resonator modules 50*a*, 50*b*, it should be understood that a two or more quadrupoles may be employed for focusing purposes. Similarly, it should be understood that variations in the linac design may result in quadrupoles not being used between each pair of resonator modules.

For a new ion beam, the tuning of the beam usually starts with the tuning, that is determining the operating parameters of amplitude, frequency and phase, of the resonator modules 50*a–j* to achieve desired beam energy with a minimum energy spread. This is measured by the post-FEM faraday cup 82. Typically, the resonator frequency is set at 13.56 megahertz (MHz) and the resonator amplitude and phase tuning are performed by an autotune system 74 of the control electronics 70, but could also be done manually by an operator of the implanter 10 via the control console 72.

After resonator module tuning is complete, the quadrupoles are tuned to achieve maximum transmission rate (that is, maximizing the final beam current, $I_{res}$, for a given injection beam current, $I_{injection}$). The operating parameter for each of the unipolar quadrupoles 60*a–l* is the magnitude of DC voltage applied across the pair of energized quadrupole electrodes, $V_{applied}$. Each quadrupole is tunable independently, that is, the operating parameter of each quadrupole, $V_{applied}$, may be varied independently from the voltage applied to each of the other quadrupoles. This makes quadrupole tuning difficult. Because of the difficulty, manual tuning is typically not used and the implanter operator relies on the autotune system 74 of the control electronics 70. Phase tuning of the resonator modules and quadrupole tuning require different tuning algorithms.

The autotune system of prior art implanters typically used a sequential combination of single parameter tuning steps, with each tuning step optimizing or setting a single control variable. In the case of resonator module tuning, the control variables were voltage amplitude, frequency and phase, in the case of quadrupole tuning, the control variable was applied DC voltage, $V_{applied}$.

Using an analogy, the sequential tuning of the prior art autotune system is comparable to a mountain climber seeking to reach the top of the mountain by standing on one foot and searching in either a north-south direction or an east-west direction for a higher position with his other foot. If he finds a higher position with his "searching" foot, he moves to that position and repeats the searching process until he can no longer find a higher position with his "searching" foot.

Generally, the relation between final beam energy, $I_{res}$, and each phase is a sharp monotonically increasing function. Thus, sequential tuning can easily find the global optimal or peak value for each phase by moving along the monotonically increasing function in a step-wise fashion. However, sequential tuning does not work well for tuning the quadrupoles because there is strong interaction between the quadrupoles. The relationship between the final beam current, $I_{res}$, and the quadrupoles has been found to be a multi-peak function.

Accordingly, tuning of the quadrupoles, that is, finding a $V_{applied}$ value for each quadrupole, requires the use of a multi-variable search process, preferably, a heuristic multi-variable searching algorithm. Further, it has been found that the multi-variable search process is more efficiently utilized if the quadrupoles are first classified into a predetermined number of groups and then the multi-variable search process is applied on a group by group basis rather than applying the search process to all quadrupoles in total. Specifically, the search process is applied to the quadrupoles in a first group to find a $V_{applied}$ value for each quadrupole in that first group, then the search process is applied to the quadrupoles in a second group to find a $V_{applied}$ value for each quadrupole in that second group and so on until all the groups have been completed.

While there is no guarantee that a heuristic search process will generate a $V_{applied}$ value for each of the quadrupoles that achieves a global maximum transmission rate for a given injection beam current, $I_{injection}$, a good heuristic search process will generate a set of $V_{applied}$ values that have an acceptably high transmission rate while requiring a suitably short time period for executing the tuning process.

One heuristic, multi-parameter searching process that has been found to generally yield higher transmission rates with shorter tuning time requirements than sequential tuning algorithms is the Simplex algorithm. For the quadrupoles in a quadrupole group, the autotune system 74 utilizes the Simplex algorithm and measurements of final beam current, $I_{res}$, provided by the Faraday cup 82 to find a set of $V_{applied}$ values for the quadrupoles in the group that results in a maximum or near maximum transmission rate, that is, a maximum final beam current, $I_{res}$, for a given injection current, $I_{injection}$.

Figure 5:
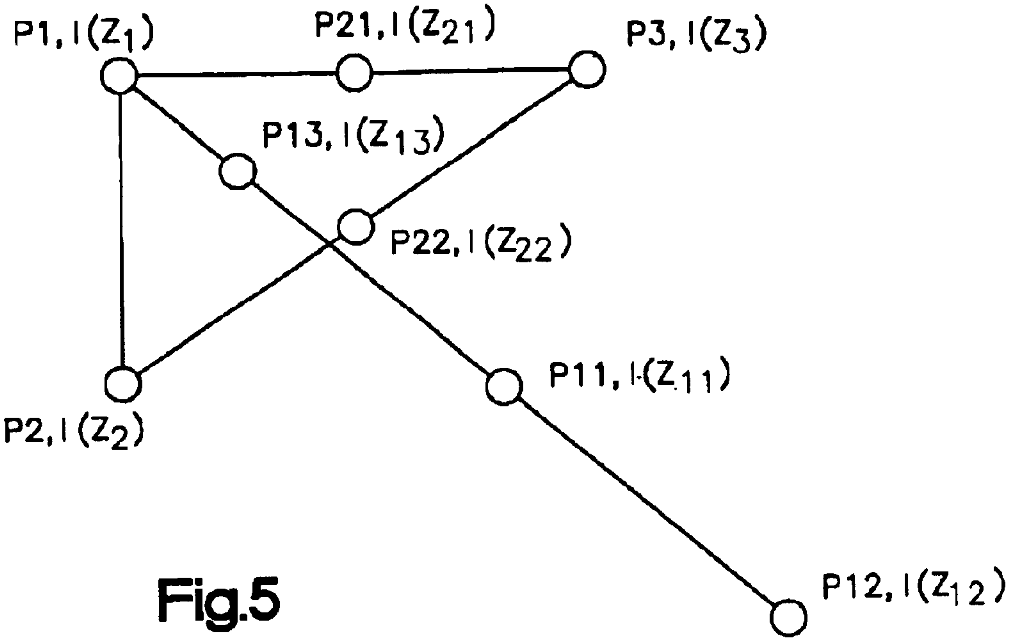
FIG. 5 is an illustration of application of the Simplex algorithm to find optimal applied voltages for two quadrupoles.

A simplified two variable (two quadrupoles) tuning example using the Simplex algorithm is illustrated in FIG. 5 and is explained below.

Assumptions: A two parameter system with variables V1 and V2 where V1 is the $V_{applied}$ for quadrupole 1 and V2 is the $V_{applied}$ for quadrupole 2 and further where the system output is the final beam current, $I_{res}$.

The steps of the Simplex algorithm are as follows:

1) Starting from point P1 having variable values of $x_1$ for variable V1 and $y_1$ for variable V2, i.e., P1(V1($x_1$), V2($y_1$)) resulting in final beam current $z_1$, $I_{res}(z_1)$.

2) Generate two test points P2 and P3 and determine the final beam current for each, where P2 includes an incremental change, $\Delta x_1$, in the value of $x_1$ and P3 includes an incremental change, $\Delta y_1$ in the value of $y_1$:

P2(V1($x_1+\Delta x_1$), V2($y_1$)) resulting in a final beam current $z_2$, $I_{res}(z_2)$; and

P3(V1($x_1$), V2($y_1+\Delta y_1$)) resulting in a final beam current $z_3$, $I_{res}(z_3)$.

3) If $I_{res}(z_1)$, $I_{res}(z_2)$, and $I_{res}(z_3)$ are close enough, then select from test points P1, P2, P3 resulting in maximum value of $I_{res}$ and stop. For example, if test point P1 resulted in the maximum value of $I_{res}$ then the $V_{applied}$ value for quadrupole 1 will be $x_1$ and the $V_{applied}$ value for quadrupole 2 will be $y_1$.

4) If $I_{res}(z_1)$, $I_{res}(z_2)$, and $I_{res}(z_3)$ are not close enough and assuming $I_{res}(z_1)<I_{res}(z_2)<I_{res}(z_3)$, step out from P1 and generate point P11 by reflection away from the lowest point P1 and determine the final beam current, $I_{res}(z_{11})$, for P11.

4a. If $I_{res}(z_{11})>I_{res}(z_3)$, generate P12 which is one more step out from P1 along the direction of P11, determine the final beam current, $I_{res}(Z_{12})$, for P12.

If $I_{res}(z_{12})>I_{res}(z_{11})$, set P1=P12, go back to (3).

If $I_{res}(z_{12})<I_{res}(z_{11})$, set P1=P11, go back to (3).

4b. If $I_{res}(z_{11})<I_{res}(z_1)$, generate P13 by moving from P1 halfway toward the middle point of a line between P2 and P3, determine the final beam current, $I_{res}(z_{13})$, for P13.

If $I_{res}(z_{13})>I_{res}(z_1)$, set P1=P13, go back to (3).

If $I_{res}(z_{13})<I_{res}(z_1)$, generate new triangle vertices P21 and P22 where P21 is located halfway between P1 and P3 and P22 is located halfway between P2 and P3, go back to (3).

4c. If $I_{res}(z_{11})>I_{res}(z_2)$ and $I_{res}(z_{11})<I_{res}(z_3)$, set P1=P11, go back to (3).

Using the analogy of the mountain climber, in the context of optimizing a two variable problem, the Simplex algorithm can be thought of in terms of an extendable three legged stool used by the mountain climber. The mountain climber repeatedly flips the stool so that the two highest legs remain in place, while the lowest leg is searching for an uphill position. If the search by the lowest leg for an uphill position is successful, that is, the lower leg ends up being above the two legs that remained in place, the climber extends the lowest leg further in the same direction to see if even further improvement is possible. If the extension of the lowest leg is not successful, the climber retracts the lowest leg to take a smaller step. This procedure proceeds until the stool hopefully is straddling the summit of the mountain. When all three legs are at the nearly the same height, it is assumed by the Simplex algorithm that the summit has been reached.

It has been found that there are three major functions of the quadrupoles 60*a–l* as follows:

1) transforming the ion beam 14 coming out of the analyzing magnet unit (AMU) 22 so that it is properly oriented to enter the ion accelerator 24;

2) transporting the ion beam 14 through the ion accelerator 24; and 3) transforming the ion beam 14 coming out of the ion accelerator 24 so that it is properly oriented to enter the final energy magnet (FEM) 30.

These three functions are primarily accomplished by different quadrupoles. In a 12 quadrupole ion implanter, the first three quadrupoles 60*a–c* (group 1 quadrupoles) primarily function as the matching unit between the AMU 22 and the ion accelerator 24, that is, they transform the emittance orientation of the ion beam 14 as it leaves the AMU 22 to the orientation required by the ion accelerator 24. The last three quadrupoles 60*j–l* (group 3 quadrupoles) primarily function as the matching unit between the ion accelerator 24 and the FEM 30, that is, they transform the ion beam 14 to fit the acceptance of an entry aperture of the FEM 30. The remaining middle six quadrupoles 60*d–i* (group 2 quadrupoles) primarily function as the transportation unit, that is, they sustain the ion beam 14 though the ion accelerator 24.

The number of variables in each of the three groups is between three and six. Thus, even with the largest group of quadrupoles 60*d–i,* the control electronics 70 and specifically the autotune system 74 apply the Simplex algorithm to simultaneously find the applied voltages, $V_{applied}$, for only six quadrupoles 60*d–l*. For the other two groups, the Simplex algorithm is applied by the autotune system 74 to simultaneously find the applied voltages, $V_{applied}$, for three quadrupoles, 60*a–c* and then 60*j–l.*

Within each of the three groups, the Simplex algorithm is applied by the control electronics 70 to find the optimal or near-optimal values of $V_{applied}$, for the quadrupoles in each group. As can be seen in the flow chart in FIG. 4, the control electronics 70 determines values for applied voltage, $V_{applied}$, for each of the quadrupoles in the group by applying the Simplex algorithm to iteratively generate applied voltage values for each of the quadrupoles, simultaneously measuring final beam current, $I_{res}$, and inputting the final beam current values back into the Simplex algorithm so that the algorithm can iteratively move to a set of applied voltage value for each of the quadrupoles in the group that result in a maximum transmission rate among the applied voltage values generated and tested by the Simplex algorithm. Stated another way, for each group of quadrupoles, the control electronics 70 utilizes the Simplex algorithm and the Faraday cup 82 to iteratively generate and test different values of $V_{applied}$ for the quadrupoles in the group. Moving from initial starting applied voltages for each of the quadrupoles, the Simplex algorithm iteratively generates new applied voltages values and receives as input the associated final beam current values. The Simplex algorithm progressively moves to improved final beam current values (i.e., improved transmission rates) and ultimately ceases further iterations when the measured final beam current for successive test points are "close" enough for the algorithm to conclude an optimal set of applied voltage values for the quadrupoles in the group has been achieved.

Figure 4:
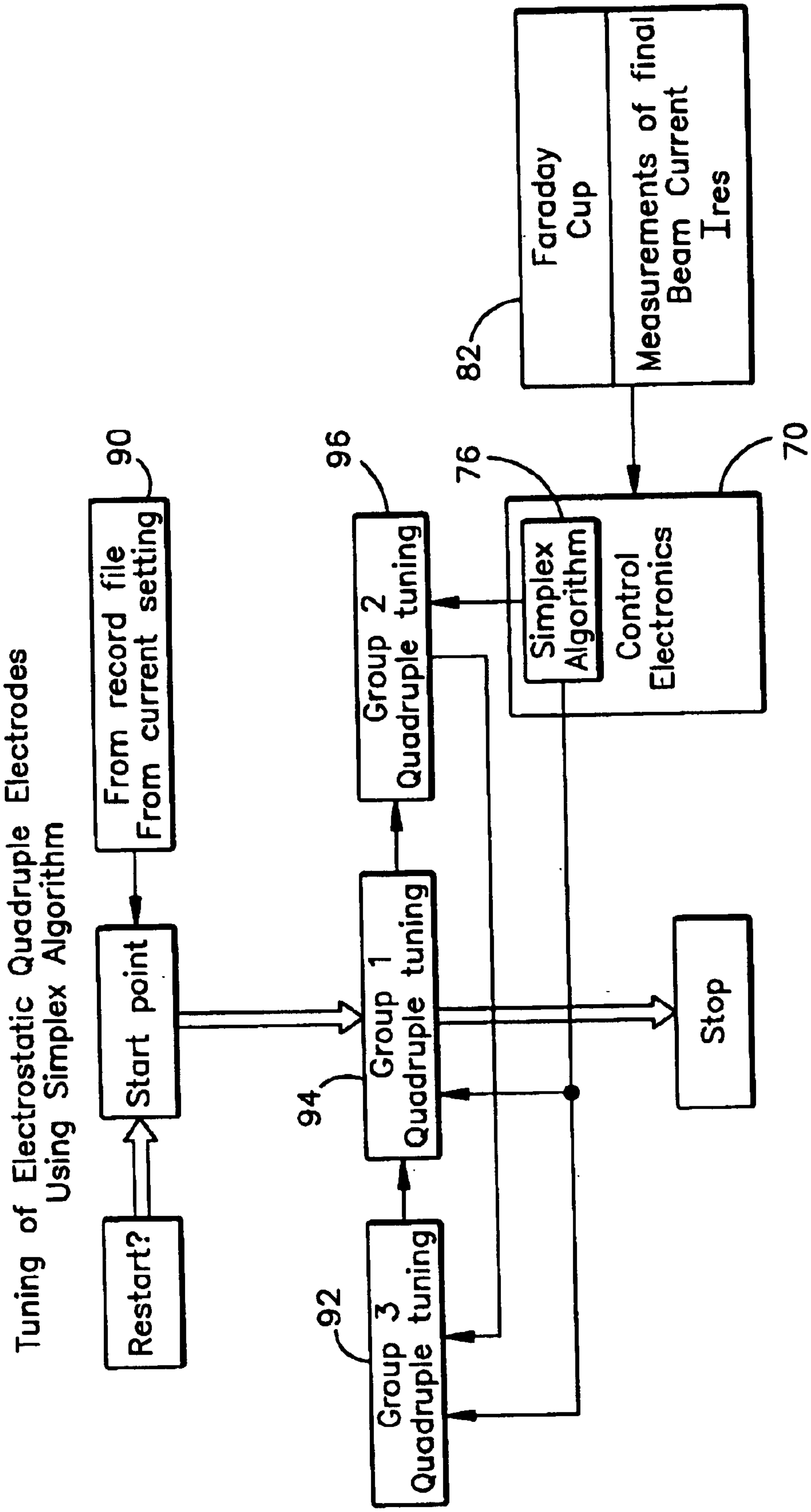
FIG. 4 is a flow chart showing the method of the present invention of tuning a plurality of electrostatic quadrupoles.

As can be seen in FIG. 4, the control electronics 70 starting from a current set of applied voltage values 90, utilizes the Simplex algorithm 76 and the measurement of the final beam current, $I_{res}$, output by the Faraday cup 82 to first tune the quadrupoles of group 3 (quadrupoles 60*j–l* serving as matching unit between the ion accelerator 24 and the FEM 30) (box labeled 92), then utilizes the Simplex algorithm and the measurement of the final beam current, $I_{res}$, to tune the quadrupoles of group 1 (quadrupoles 60*a–c* serving as matching unit between the AMU 22 and the ion accelerator 24) (box labeled 94), and finally utilizes the Simplex algorithm and the measurement of the final beam current, $I_{res}$, to tune the quadrupoles of group 2 (quadrupoles 60*d–i* serving to transport the ion beam 14 through the ion accelerator 24) (box labeled 96).

Because the Simplex algorithm is applied to each of the three groups of quadrupoles independently and further because the Simplex algorithm is a heuristic algorithm, there is no way to insure that an optimal transmission rate has been achieved with the set of applied voltage values selected by the Simplex algorithm. However, empirical results indicate that the Simplex algorithm generally produces superior transmission rates with shorter tuning times compared to the prior art sequential tuning methodology.

One of skill in the art will recognize that while the method of quadrupole tuning disclosed herein is discussed with respect to an ion beam implanter having a linac or RF accelerator, the tuning method is also suitable for any ion beam implanter utilizing electrostatic quadrupoles regardless of whether or not the implanter utilizes an RF accelerator for ion acceleration.

In one preferred embodiment of the present invention, the electrostatic quadrupole tuning method is applied, independently on a group by group basis, as explained above, to the quadrupoles of the each of the three groups and a maximum final beam current, $I_{res}$, is found. If the determined maximum final beam current is found to be suitable, the tuning process is terminated and the quadrupoles are accordingly tuned to achieve the determined maximum beam current (that is, the maximum final beam current found using three group tuning). If, however, the determined final beam current is deemed not to be suitable, then the predetermined number of groups is changed from three to one, that is, all of the quadrupoles are combined into a single group and the tuning method of the present invention is applied to the single group including all of the quadrupoles. A new maximum final beam current, $I_{res}$, is found. Generally, this new final beam current will be greater than or equal to the maximum final beam current found through the three group quadrupole tuning process. The quadrupoles are accordingly tuned to achieve the new maximum final beam current.

In general, if a satisfactory ion beam (as measured by beam energy, beam energy spread, final beam current, and/or other parameters) is not achieved via the quadrupole tuning method using a first predetermined number of groups of quadrupoles and applying the tuning method to the quadrupoles classified in each group on a group by group basis, the number of predetermined groups may be changed to a second predetermined number of groups, each of the quadrupoles classified into one of the second predetermined number of groups and the quadrupole tuning method reapplied to the quadrupoles classified in each of the second predetermined number of groups. If application of the tuning method to the second predetermined number of groups results in a satisfactory ion beam, then the process stops and the tuning values determined are used for the quadrupoles. If a satisfactory ion beam is not achieved, the predetermined number of groups may again be changed and the process repeated. This change in the predetermined number of groups and reapplication of the tuning algorithm may be repeated as many times as necessary to achieve a suitable ion beam.

Figure 6:
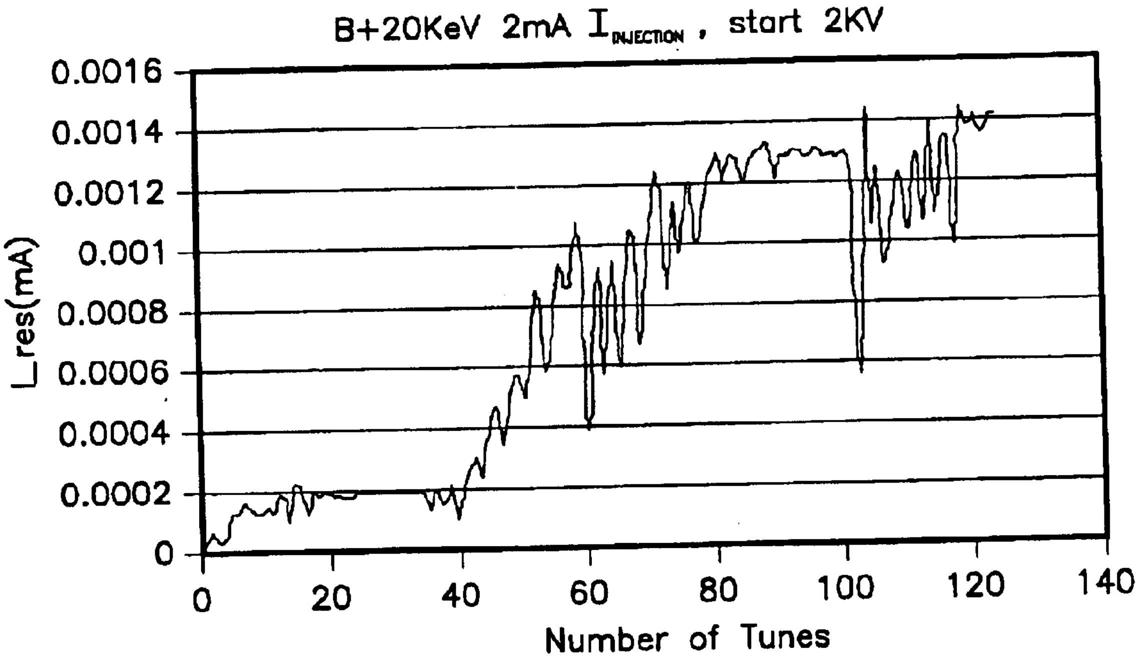
FIG. 6 is a graph plotting final beam current of an ion beam as a function of the number of tunes of the tuning method of the present invention for an Boron+20 keV DC ion beam having an injection current of 2 milliamps (mA) and with all electrostatic quadrupoles initially set to 2.0 kilovolts (kV)

A graph showing Simplex algorithm quadrupole tuning comparing final beam current versus the number of tunes for a Boron+20 keV DC ion beam with $I_{injection}$=2 mA and a starting voltage of 2 kV is shown in FIG. 6. All 12 quadrupoles were set to the same initial values of applied voltage, $V_{applied}$, namely, 2 kV DC. FIG. 7 shows empirical test data comparing autotuning using sequential tuning versus using Simplex algorithm multi-parameter heuristic searching for the same Boron+20 keV DC ion beam. As can be seen from the comparison, in most cases, utilizing the Simplex algorithm heuristic results in both improved transmission rate and reduced tuning time compared to sequential tuning.

While the present invention has been described with a degree of particularity, it is the intent that the invention include all modifications and alterations from the disclosed design falling with the spirit or scope of the appended claims.

We claim:

1. A method of tuning a plurality of electrostatic quadrupole of an ion beam implanter, the steps of the method comprising:

a) grouping each of the plurality of electrostatic quadrupole into one of a predetermined number of groups based on a primary function of the quadrupole, the predetermined number of groups being at least one less than a number of electrostatic quadrupoles; and b) for each of the groups of quadrupoles, energizing the quadrupoles in the group by iteratively substituting values for a voltage to be applied to each of the quadrupoles in the group using a multi-parameter heuristic algorithm and measuring final beam current measured downstream of the ion accelerator to determine a set of applied voltage values that maximize the final beam current among those applied voltage values tested and utilizing the set of applied voltage values to energize the quadrupoles in the group.

2. The method of tuning a plurality of electrostatic quadrupoles of an ion beam implanter of claim 1 wherein ion implanter includes a radio frequency ion accelerator and the predetermined number of groups is three and the primary function of quadrupoles each of the three groups is as follows:

a) group 1—functioning as a matching unit between an analyzing mass unit of the ion beam implanter and the ion accelerator by transforming an emittance orientation of the an ion beam to an orientation of an emittance of the ion accelerator;

b) group 2—transporting the ion beam through the ion accelerator; and c) group 3—functioning as a matching unit between the ion accelerator and a final energy magnet of the ion implanter by transforming the emittance orientation of the ion beam to an emittance of the final energy magnet.

3. The method of tuning a plurality of electrostatic quadrupoles of an ion beam implanter of claim 1 wherein the multi-parameter heuristic algorithm is the Simplex algorithm.

4. The method of tuning a plurality of electrostatic quadrupoles of an ion beam implanter of claim 1 wherein the predetermined number of quadrupoles identified for each of the groups of quadrupoles is less than or equal to six.

5. The method of tuning a plurality of electrostatic quadrupoles of an ion beam implanter of claim 1 wherein the final beam current of the ion beam is measured downstream of a final energy magnet of the ion implanter.

6. A method of tuning a plurality of electrostatic quadrupole of an ion beam implanter, the steps of the method comprising:

a) grouping each of the plurality of electrostatic quadrupole into one of a predetermined number of groups, the predetermined number of groups being at least one less than a number of electrostatic quadrupoles; and b) for each of the groups of quadrupoles, energizing the quadrupoles in the group by iteratively substituting values for a voltage to be applied to each of the quadrupoles in the group using a multi-parameter heuristic algorithm and measuring final beam current measured downstream of the ion accelerator to determine a set of applied voltage values that maximize the final beam current among those applied voltage values tested;

c) measuring one or more parameters of the ion beam upon completion of step (b);

d) determining if the ion beam is acceptable by comparing the one or more measured parameters of the ion beam to one or more standards:

i) if the resulting final beam current is acceptable, then utilizing the determined sets of applied voltage values to energize the quadrupoles in each of the groups; and ii) if the resulting final beam current is not acceptable, then changing the predetermined number of groups and repeating steps (a)–(d).

7. The method of tuning a plurality of electrostatic quadrupoles of an ion beam implanter of claim 6 wherein the one or more measured parameters is final ion beam current.

8. A method of tuning a plurality of electrostatic quadrupoles and a plurality of resonators of an ion beam implanter having an ion accelerator for accelerating ions of an ion beam along a path of travel from an ion source to a workpiece, the steps of the method comprising:

a) tuning the plurality of resonators to achieve a desired final beam energy with a minimum energy spread of the ion beam;

b) tuning the plurality of quadrupoles to maximize a transmission rate of the ion beam where the transmission rate is a ratio of a final beam current of the ion beam measured downstream of the ion accelerator to an injection beam current measured upstream of the ion accelerator, the step of tuning of the plurality of quadrupoles including the substeps of:

1) classifying each of the plurality of electrostatic quadrupoles into one of a predetermined number of groups based on a primary function of the quadrupole, the predetermined number of groups being at least one less than a number of electrostatic quadrupoles; and 2) for each of the groups of quadrupoles, tuning the quadrupoles in the group by iteratively substituting values for a voltage to be applied to each of the quadrupoles in the group using a multi-parameter heuristic algorithm and measuring final beam current to determine a set of applied voltage values that maximize the transmission rate among those applied voltage values tested and utilizing the set of applied voltage values to tune the quadrupoles in the group.

9. The method of tuning a plurality of electrostatic quadrupoles and a plurality of resonators of an ion beam implanter of claim 8 wherein the predetermined number of groups in the tuning of the plurality of quadrupoles step is three and the primary function of quadrupoles each of the three groups is as follows:

a) group 1—functioning as a matching unit between an analyzing mass unit of the ion beam implanter and the ion accelerator by transforming an emittance orientation of the an ion beam to an orientation of an emittance of the ion accelerator;

b) group 2—transporting the ion beam through the ion accelerator; and c) group 3—functioning as a matching unit between the ion accelerator and a final energy magnet of the ion implanter by transforming the emittance orientation of the ion beam to an emittance of the final energy magnet.

10. The method of tuning a plurality of electrostatic quadrupoles and a plurality of resonators of an ion beam implanter of claim 8 wherein the heuristic algorithm is the Simplex algorithm.

11. A method of tuning a plurality of electrostatic quadrupoles of an ion beam implanter the steps of the method comprising:

a) grouping each of the plurality of electrostatic quadrupoles into one of a predetermined number of groups based on a primary function of the quadrupole;

b) identifying a predetermined number of variables for each of the predetermined number of group having the greatest effect on maximizing a transmission rate of the ion beam where the transmission rate is a ratio of a final beam current of the ion beam measured downstream of the ion accelerator to an injection beam current measured upstream of the ion accelerator; and c) for each of the groups of quadrupoles, energizing the quadrupoles in the group by iteratively substituting values for each of the predetermined number of variables identified in step (b) using a multi-variable heuristic algorithm and measuring final beam current to determine a set of variable values that maximize the transmission rate among those values tested and utilizing the set of variable values to energize the quadrupoles in the group.

12. The method of tuning a plurality of electrostatic quadrupoles of an ion beam implanter of claim 11 wherein the predetermined number of groups is three and the primary function of quadrupoles each of the three groups is as follows:

a) group 1—functioning as a matching unit between an analyzing mass unit of the ion beam implanter and the ion accelerator by transforming an emittance orientation of the an ion beam to an orientation of an emittance of the ion accelerator;

b) group 2—transporting the ion beam through the ion accelerator; and c) group 3—functioning as a matching unit between the ion accelerator and a final energy magnet of the ion implanter by transforming the emittance orientation of the ion beam to an emittance of the final energy magnet.

13. The method of tuning a plurality of electrostatic quadrupoles of an ion beam implanter of claim 11 wherein the multi-variable heuristic algorithm is the Simplex algorithm.

14. The method of tuning a plurality of electrostatic quadrupoles of an ion beam implanter of claim 11 wherein one of the predetermined number of variables identified for each of the groups of quadrupoles is voltage applied to each of the plurality of quadrupoles.

15. The method of tuning a plurality of electrostatic quadrupoles of an ion beam implanter of claim 11 wherein the final beam current of the ion beam is measured downstream of a final energy magnet of the ion implanter.

16. A method of tuning a plurality of electrostatic quadrupoles and a plurality of resonators of an ion beam implanter utilizing an ion accelerator for accelerating ions of an ion beam along a path of travel from an ion source to a workpiece positioned in an implantation chamber, the steps of the method comprising:

a) tuning the plurality of resonators to achieve a desired final beam energy with a minimum energy spread of the ion beam;

b) tuning the plurality of quadrupoles to maximize a transmission rate of the ion beam where the transmission rate is a ratio of a final beam current of the ion beam measured downstream of the ion accelerator to an injection beam current measured upstream of the ion accelerator, the step of tuning of the plurality of quadrupoles including the substeps of:

1) classifying each of the plurality of electrostatic quadrupoles into one of a predetermined number of groups based on a primary function of the quadrupole;

2) identifying a predetermined number of variables for each group having the greatest effect on maximizing a transmission rate of the ion beam wherein the transmission rate is a ratio of a final beam current of the ion beam measured downstream of the ion accelerator to an injection beam current measured upstream of the ion accelerator; and 3) for each of the groups of quadrupoles, energizing the quadrupoles in the group by iteratively substituting values for each of the identified variables for the group using a multi-parameter heuristic algorithm and measuring the final beam current to determine a set of variable values that provide a maximum transmission rate among values tested and utilizing the set of variable values to energize the quadrupoles in the group.

17. The method of tuning a plurality of electrostatic quadrupoles and a plurality of resonators of an ion beam implanter of claim 16 wherein the predetermined number of groups in the tuning of the plurality of quadrupoles step is three and the primary function of quadrupoles each of the three groups is as follows:

a) group 1—functioning as a matching unit between an analyzing mass unit of the ion beam implanter and the ion accelerator by transforming an emittance orientation of the an ion beam to an orientation of an emittance of the ion accelerator;

b) group 2—transporting the ion beam through the ion accelerator; and c) group 3—functioning as a matching unit between the ion accelerator and a final energy magnet of the ion implanter by transforming the emittance orientation of the ion beam to an emittance of the final energy magnet.

18. The method of tuning a plurality of electrostatic quadrupoles and a plurality of resonators of an ion beam implanter of claim 16 wherein the heuristic algorithm is the Simplex algorithm.

19. The method of tuning a plurality of electrostatic quadrupoles and a plurality of resonators of an ion beam implanter of claim 16 wherein one of the variables identified for each of the groups of quadrupoles is voltage applied to each of the plurality of quadrupoles.

20. An ion beam implanter comprising:

a) an ion accelerator for accelerating ions of an ion beam along a path of travel from an ion source to a workpiece positioned in an implantation chamber;

b) a plurality of electrostatic quadrupoles energizable to control divergence of the ion beam along its path of travel; and c) control electronics coupled to the plurality of quadrupoles to control a voltage applied to each quadrupole of the plurality of quadrupoles, the control electronics operating to tune the plurality of quadrupoles by:

1) grouping each of the plurality of electrostatic quadrupole into one of a predetermined number of groups, the predetermined number of groups being at least one less than a number of electrostatic quadrupoles; and 2) for each of the groups of quadrupoles, energizing the quadrupoles in the group by iteratively substituting values for a voltage to be applied to each of the quadrupoles in the group using a multi-parameter heuristic algorithm and measuring final beam current measured downstream of the ion accelerator to determine a set of applied voltage values that maximize the final beam current among those applied voltage values tested and utilizing the set of applied voltage values to energize the quadrupoles in the group.

21. A method of tuning an ion beam implanter utilizing a radio frequency ion accelerator, the steps of the method comprising:

a) grouping each of a plurality of electrostatic quadrupoles positioned with respect to the radio frequency accelerator into groups wherein a number of groups of quadrupoles being at least one less than a number of electrostatic quadrupoles; and b) for each of the groups of quadrupoles, tuning the quadrupoles in the group by iteratively energizing each of the quadrupoles in the group and measuring final beam current downstream of the ion accelerator for maximizing the final beam current and utilizing a set of applied voltage values to energize the quadrupoles in the group.

22. The method of tuning a plurality of electrostatic quadrupoles of an ion beam implanter of claim 21 wherein the tuning of quadrupoles in each of the groups of quadrupoles is done using a multi-variable heuristic algorithm.

23. The method of tuning a plurality of electrostatic quadrupoles of an ion beam implanter of claim 21 wherein the grouping of the plurality of quadrupoles into groups is done base on a primary function of each quadrupole.

24. The method of tuning a plurality of electrostatic quadrupoles of an ion beam implanter of claim 23 wherein the number of groups of quadrupoles is three and the primary function of quadrupoles each of the three groups is as follows:

a) group 1—functioning as a matching unit between an analyzing mass unit of the ion beam implanter and the ion accelerator by transforming an emittance orientation of the an ion beam to an orientation of an emittance of the ion accelerator;

b) group 2—transporting the ion beam through the ion accelerator; and c) group 3—functioning as a matching unit between the ion accelerator and a final energy magnet of the ion implanter by transforming the emittance orientation of the ion beam to an emittance of the final energy magnet.

* * * * *